US011699543B2

United States Patent
Han et al.

(10) Patent No.: US 11,699,543 B2
(45) Date of Patent: Jul. 11, 2023

(54) SPIN WAVE SWITCH AND FILTER BASED ON MAGNONIC CRYSTAL

(71) Applicant: Institute of Physics, Chinese Academy of Sciences, Beijing (CN)

(72) Inventors: Xiufeng Han, Beijing (CN); Yaowen Xing, Beijing (CN); Zhengren Yan, Beijing (CN)

(73) Assignee: Institute of Physics, Chinese Academy of Sciences, Beijing (CN)

(*) Notice: Subject to any disclaimer, the term of this patent is extended or adjusted under 35 U.S.C. 154(b) by 0 days.

(21) Appl. No.: 17/451,460

(22) Filed: Oct. 19, 2021

(65) Prior Publication Data

US 2022/0122755 A1    Apr. 21, 2022

(30) Foreign Application Priority Data

Oct. 20, 2020 (CN) .......................... 202011123159.4

(51) Int. Cl.
*H01F 10/32* (2006.01)
*H03H 1/00* (2006.01)

(52) U.S. Cl.
CPC ............ *H01F 10/3268* (2013.01); *H03H 1/00* (2013.01); *H03H 2001/0057* (2013.01)

(58) Field of Classification Search
CPC ........ H01F 10/3268; H01P 3/165; H03H 1/00
USPC ........................................................ 333/147
See application file for complete search history.

(56) References Cited

U.S. PATENT DOCUMENTS

2017/0346149 A1* 11/2017 Ciubotaru ............... H01F 10/32

* cited by examiner

*Primary Examiner* — Rakesh B Patel
(74) *Attorney, Agent, or Firm* — Knobbe, Martens, Olson & Bear, LLP

(57) ABSTRACT

The present disclosure relates to a spin wave switch and a filter based on a magnonic crystal. According to one embodiment, a magnonic crystal device may include a ferromagnetic layer and an antiferromagnetic planar periodic structure set on the ferromagnetic layer. The magnonic crystal device of the present disclosure may be used as a spin wave switch to effectively regulate and control the transmission coefficient of the spin wave, or may be used as a spin wave filter to filter the spin wave of a specific frequency.

17 Claims, 5 Drawing Sheets

SPIN WAVE SWITCH AND FILTER BASED ON MAGNONIC CRYSTAL

RELATED APPLICATION INFORMATION

This application claims priority to Chinese Application Serial No. CN202011123159.4 filed on Oct. 20, 2020, the disclosure of which is incorporated in its entirety by reference herein.

TECHNICAL FIELD OF THE DISCLOSURE

The present disclosure generally relates to the field of magnonics and magnonic devices, and in particular to a magnonic crystal device and a spin wave switch and filter including the magnonic crystal device.

BACKGROUND

Spin waves are the intrinsic excitation of electron spin subsystem in a magnetic ordered medium, and are earliest proposed by Bloch in 1930. Thereafter, Holstein, Primakoff, and Dyson introduced a concept of minimum quantum element-magnetic exciton (magnon). Each magnon carries a spin angular momentum of h. Therefore, the magnon can transmit the spin information, and is considered to be an information carrier with great application prospect. The magnonics is for studying the fields of information transmission, storage and processing by using magnons. In the field of magnonics, the regulation of magnon transport is a very important branch. The construction of artificial magnonic crystal is one of the most effective and commonly used methods to regulate and control the transport of magnons.

As early as 1976, Sykes, Adam, and Collins had experimentally studied the transmission properties of spin waves (magnons) in a periodic structure for the first time. This work is considered to be the first work of magnonic crystal, although there was no concept of magnonic crystal at that time. In 2001, Nikitov proposed the concept of magnonic crystal for the first time. The magnonic crystal refers to an artificially constructed media with magnetic properties thereof changing periodically and magnonic spectrum thereof having significantly different properties compared with uniform media. The magnonic spectrum of magnonic crystal has a band structure, and a band gap exists in the band structure, preventing spin waves (magnons) of certain frequencies from passing through. All magnonic crystals use such property of frequency-selection to realize artificial regulation of spin wave (magnon) transmission.

According to the type of interaction that has been considered, spin waves can be mainly divided into three types: (1) spin waves dominated by dipole interaction (magnetostatic spin waves); (2) dipole-exchange spin waves that coexist with the dipole and exchange interactions; (3) spin waves dominated by exchange interactions (exchange spin waves). The magnetostatic spin wave is a wave with a relatively long wavelength, and its frequency is generally between 0.5 GHz to 10 GHz. The exchange spin wave is a short wavelength wave (the wavelength is generally less than 100 nm) with a wavelength of generally between 20 GHz to 1 THz, and the frequency thereof is high. The dipole-exchange spin wave is between the both. A magnonic crystal device based on the magnetostatic spin waves has the advantage that the manufacturing difficulty of the device is small, and the excitation and the detection of the spin waves are easy to realize; while a magnonic crystal device based on the exchange spin waves has the advantages that the size of the device is small, and the information processing speed is high.

The magnonic crystals based on magnetostatic spin waves are easier to be realized experimentally, therefore, most of the traditional magnonic crystal devices are based on magnetostatic spin waves, but do not cover the exchange spin waves and the dipole-exchange spin waves. This will limit the improvement of the performance of future magnonic devices to a certain extent.

In addition to the above mentioned shortcomings, the traditional magnonic crystals also have the problems that the function of the device is single and it is difficult to be manipulated electrically. It can be seen that the traditional magnonic crystals still have many shortcomings for device applications. Therefore, it is necessary to continuously explore new magnonic crystals to overcome the above mentioned or other deficiencies in the prior art.

SUMMARY

One aspect of the present disclosure provides a magnonic crystal device, comprising: a ferromagnetic layer; and an antiferromagnetic planar periodic structure set on the ferromagnetic layer.

In some embodiments, the antiferromagnetic planar periodic structure comprises a plurality of antiferromagnetic strip-like structures that extend along a first direction and are periodically arranged along a second direction perpendicular to the first direction; or a plurality of antiferromagnetic dot-like structures arranged in a two-dimensional array.

In some embodiments, the antiferromagnetic strip-like structure has a rectangular, square, triangular, trapezoidal or semicircular cross-section shape, and the antiferromagnetic dot-like structure has a circular, ring, polygonal or hollow polygonal shape.

In some embodiments, the periodic number N of the antiferromagnetic planar periodic structure is more than 5, and the width of each structural unit in the antiferromagnetic planar periodic structure is between 100 μm and 3 nm, the spacing between two adjacent structural units being also between 100 μm and 3 nm, correspondingly, the working frequency of the magnonic crystal device may be between 0.5 GHz and 1 THz.

In some embodiments, the ferromagnetic layer has a thickness of 0.5 nm to 15 nm, and the antiferromagnetic planar periodic structure has a thickness from 1 nm to 15 nm.

In some embodiments, the magnonic crystal device further comprises a spin Hall effect layer set on one side of the ferromagnetic layer opposite to the antiferromagnetic planar periodic structure and in contact with the ferromagnetic layer, and used to switch magnetization of the ferromagnetic layer.

Another aspect of the present disclosure provides a spin wave switch, which comprises any one of above mentioned magnonic crystal devices.

In some embodiments, the frequency of the spin wave turned on or turned off by the spin wave switch is within a range of 0.5 GHz to 1 THz.

Still another aspect of the present disclosure provides a spin wave filter, which comprises any one of above mentioned magnonic crystal devices.

In some embodiments, the frequency of spin wave filtered by the spin wave filter is within a range of 0.5 GHz to 1 THz.

The above and other features and advantages of the present disclosure will be apparent from the following description to exemplary embodiments when taken in conjunction with the drawings.

DETAILED DESCRIPTION

Traditional magnonic crystal devices can only regulate and control the transmission of the magnetostatic spin waves, and their working frequencies are mostly between 0.5 GHz to 10 GHz. In addition, the Traditional magnonic crystal devices have a single function, and are difficult to be manipulated electrically. The inventors of the present disclosure propose a new magnonic crystal device, which can be used for regulating and controlling the magnetostatic spin waves and can also be used for regulating and controlling the exchange spin waves and the dipole-exchange spin waves; the working frequency of which may vary between 0.5 GHz to 1 THz; the size of which may be in the order of 100 nanometers or less, and may also be in the order of micrometer and millimeter; and which may be manipulated by a current. The magnonic crystal device has two main functions, one of which is used as a spin wave (magnon) switch, efficiently regulating and controlling the transmission coefficient of the spin wave; the other of which is used as a spin wave (magnon) filter, filtering a spin wave (magnon) of a specific frequency. These two devices are important units for constructing high frequency nanometer magnonic devices.

It should be noted that the magnetization of the ferromagnetic layer in the magnonic crystal device proposed by the inventors of the present disclosure may have three directions of x, y, and z, which respectively correspond to three configurations, respectively being (1) Type x; (2) Type y; and (3) Type z. These three configurations are respectively shown as FIG. 1A, FIG. 1B and FIG. 1C, wherein Type x and Type y respectively correspond to an in-plane magnetization, and Type z corresponds to an out of plane magnetization, or it is also referred to as a perpendicular magnetization. Under these three configurations, the spin wave transmission spectrums are completely the same, i.e. the functions of the devices are completely the same, and therefore, a suitable configuration may be selected according to specific needs in practical application.

Figure 1A:
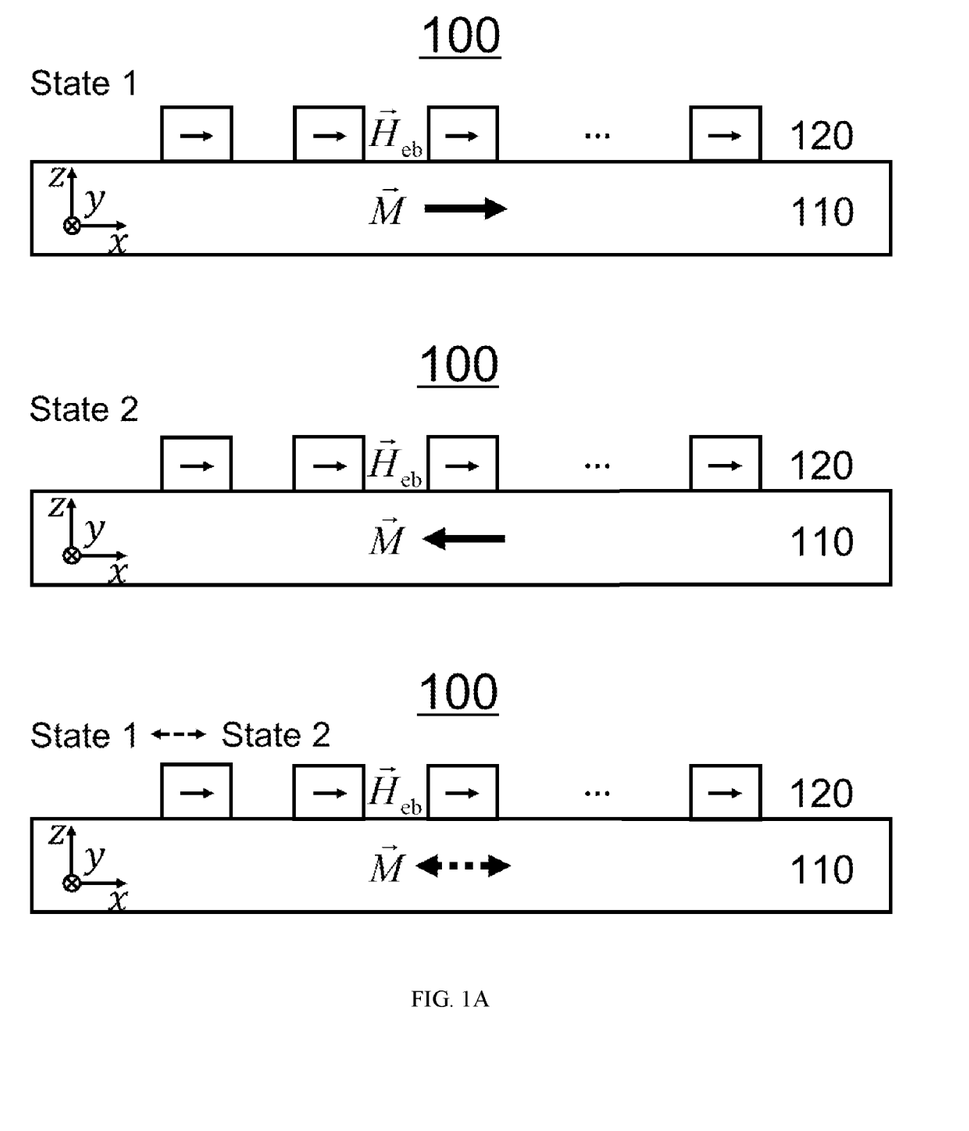
FIG. 1A is a schematic diagram of a layer structure of a magnonic crystal device according to an exemplary embodiment of the present disclosure, wherein the magnetization of the ferromagnetic layer is in the x direction.

FIG. 1A is a schematic diagram of a layer structure of a magnonic crystal device 100 according to an exemplary embodiment of the present disclosure, and this configuration is referred to as Type x. As shown in FIG. 1A, the magnonic crystal device 100 comprises a ferromagnetic layer 110 and an antiferromagnetic planar periodic structure 120 formed on the ferromagnetic layer 110. The antiferromagnetic planar periodic structure 120 may include a one-dimensional periodic arrangement structure or a two-dimensional arrangement of periodic structure. For example, in some embodiments, the antiferromagnetic planar periodic structure 120 may include a plurality of antiferromagnetic strip-like structures that extend along a first direction and are periodically arranged along a second direction perpendicular to the first direction. For example, as shown in FIG. 1A, the first direction is a y-axis direction, and the second direction is an x-axis direction. Alternatively, the antiferromagnetic planar periodic structure 120 may include a plurality of antiferromagnetic dot-like structures arranged in a two-dimensional array along the first direction and the second direction. For example, the antiferromagnetic strip-like structure discussed here may have a rectangular, square, triangular, trapezoidal, or semicircular, etc. cross-section shape, and the antiferromagnetic dot-like structure discussed here may have a circular, ring, polygonal or hollow polygonal shape. It should be understood that the principles of the present disclosure are not limited to specific antiferromagnetic structure shapes. Under such configuration shown in FIG. 1A, the exchange bias field $H_{eb}$ induced by the antiferromagnetic planar periodic structure 120 is always along the +x direction, and the magnetization M of the ferromagnetic layer 110 may be along +x, and may also be along −x, corresponding to two states: State 1 and State 2, respectively. State 1 and state 2 may be driven and switched in a pulse current way by means of a spin-orbit torque (SOT) effect. For example, a spin Hall effect layer may be formed on one side of the ferromagnetic layer 110 opposite to the antiferromagnetic planar periodic structure 120, and it is generally a heavy metal layer, such as a commonly used Pt layer or a Ta layer, and the like. A current in one direction flows through the heavy metal layer, and due to the spin Hall effect, the charge current generates a spin current, which applies a SOT effect to the magnetization M of the ferromagnetic layer 110. Under certain conditions, for example, when the current density is large enough, the magnetization M of the ferromagnetic layer 110 may be switched, for example, from +x to −x, that is, the magnonic crystal device 100 is changed from State 1 to State 2. Then, a current in the opposite direction flows through the heavy metal layer, which may make the magnetization M be restored from −x to +x, that is, the magnonic crystal device 100 is restored from State 2 to State 1. Therefore, by controlling the direction of the current, the switch between State 1 and State 2 may be realized. It should be understood that when the SOT is applied, an auxiliary magnetic field $H_z$ in a +z direction may be applied, and the auxiliary magnetic field $H_z$ may be an applied magnetic field, or it may be realized by means of an interlayer coupling field, a dipole field, a bias field, and the like, or it may be an equivalent magnetic field generated by an electric field. Therefore, this two-state switch may be fully electrically controlled. The mechanism of SOT driven magnetization switching is well known in the field, and therefore it will not be described in detail here. Since the transmission spectrums of State 1 and State 2 are different, for the spin wave (magnon) of certain specific frequencies, it may almost completely pass through the magnonic crystal in one certain state, while in the other state, it is almost completely reflected and may not pass through the magnonic crystal. Therefore, the "on" and "off" of spin waves (magnon) of certain specific frequencies may be realized by using SOT to switch State 1 and State 2, and a new type of spin wave (magnon) switching device may be constructed. On the other hand, the magnonic crystal device 100 of a specific state such as State 1 or State 2 may be used as a spin wave filter, for example, filtering out spin waves of a specific frequency, while allowing spin waves of other frequencies to pass through, i.e. band stop filter. When switching between State 1 and State 2, the filtering frequency band of the magnonic crystal device 100 will vary. It may be understood that when the magnonic crystal device 100 is used as a spin wave switch or filter a spin wave is injected on one side (for example, on the left side or the right side of the device in FIG. 1A) of the magnonic crystal device 100, and a spin wave is detected on the opposite side (for example, on the right side or the left side of the device in FIG. 1A).

Figure 1B:
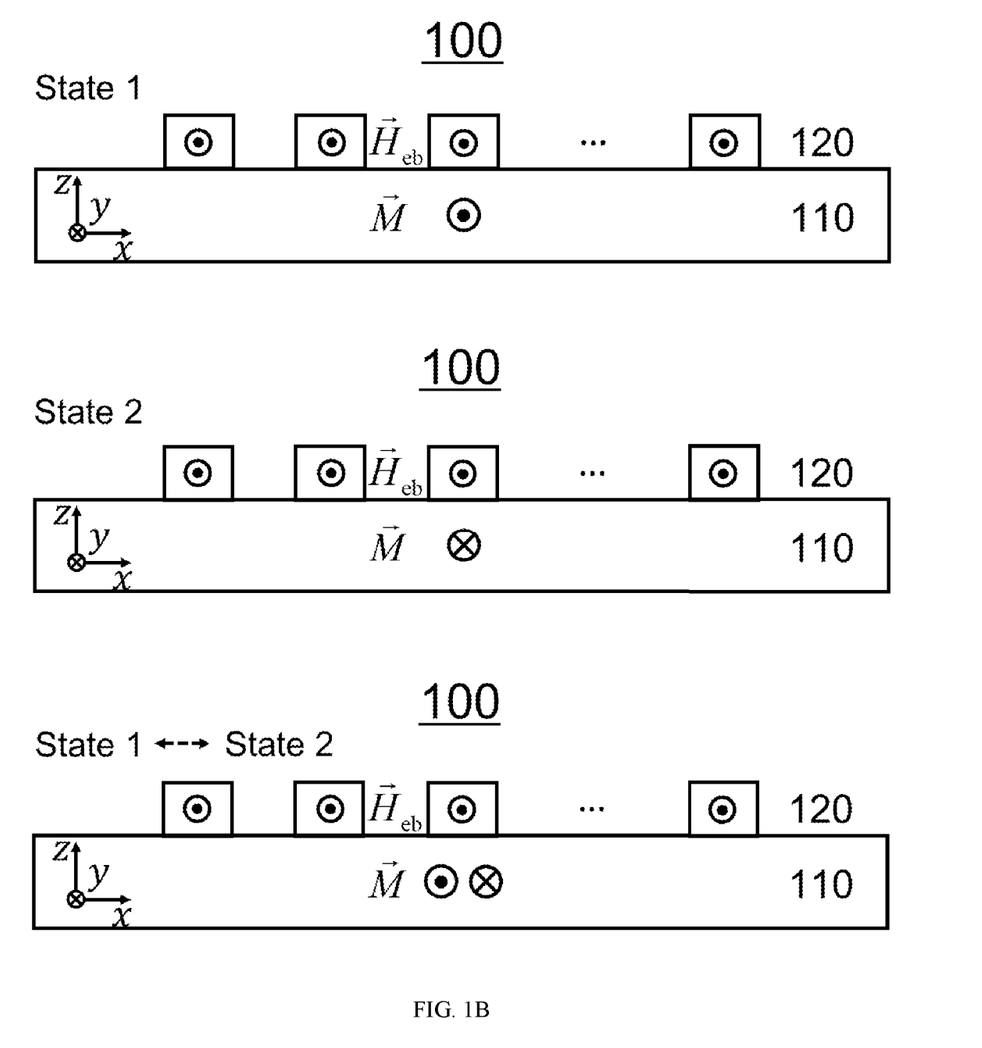
FIG. 1B is a schematic diagram of a layer structure of a magnonic crystal device according to an exemplary embodiment of the present disclosure, wherein the magnetization of the ferromagnetic layer is in the y direction.

FIG. 1B is a schematic diagram of a layer structure of the magnonic crystal device 100 according to an exemplary embodiment of the present disclosure, and this configuration is referred to as Type y. Similar to Type x, the magnonic crystal device 100 comprises a ferromagnetic layer 110 and an antiferromagnetic planar periodic structure 120. Different from FIG. 1A, under such configuration, the exchange bias field $H_{eb}$ of the antiferromagnetic planar periodic structure 120 is always along the −y direction, and the magnetization M of the ferromagnetic layer 110 may be along −y, and may also be along +y, respectively corresponding to two states: State 1 and State 2.

Similarly, State 1 and State 2 of the Type y configuration may also be switched by means of the SOT. A heavy metal layer may be grown at the bottom of the ferromagnetic layer 110, and the currents in different directions flow through the heavy metal layer, generating the SOT to make the magnetization M be changed from −y to +y, or vice versa, that is to say, the magnonic crystal device 100 is switched between State 1 and State 2. Therefore, like Type x, the magnonic crystal device 100 under the Type y configuration may also construct a new type of spin wave (magnon) switching device or a filter device.

Figure 1C:
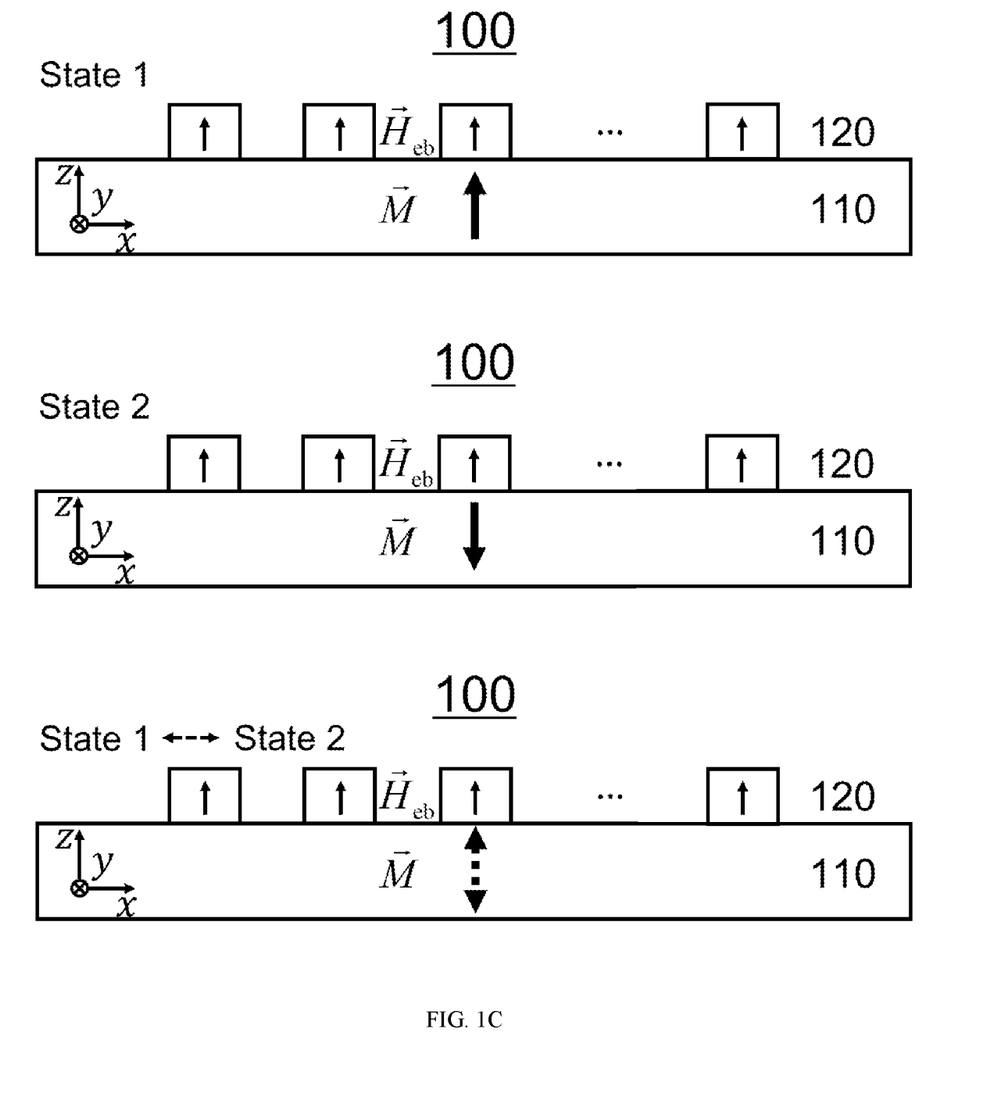
FIG. 1C is a schematic diagram of a layer structure of a magnonic crystal device according to an exemplary embodiment of the present disclosure, wherein the magnetization of the ferromagnetic layer is in the z direction.

FIG. 1C is a schematic diagram of a layer structure of the magnonic crystal device 100 according to an exemplary embodiment of the present disclosure, and such configuration is referred to as Type z. Similar to the first two configurations, the magnonic crystal device 100 comprises a ferromagnetic layer 110 and an antiferromagnetic planar periodic structure 120. The differences are that, under such configuration, the exchange bias field $H_{eb}$ induced by the antiferromagnetic periodic structure 120 is always along the +z direction, and the magnetization M of the ferromagnetic layer 120 may be along +z, and may also be along −z, respectively corresponding to two states: State 1 and State 2.

Similarly, State 1 and State 2 of the Type y configuration may also be switched by means of applying a current in a heavy metal layer. Therefore, like the first two configurations, the magnonic crystal device 100 under the Type z configuration is also a new type of spin wave (magnon) switching device or a filter device.

It should be understood that, for the Type z configuration, similar to Type x, an auxiliary magnetic field, i.e. a magnetic field $H_x$ in the +x direction, may also be used when realizing the SOT magnetic switch. The auxiliary magnetic field $H_x$ may be realized by means of an interlayer coupling field, a dipole field, or a bias field, and the like. Therefore, the two-state switch of the Type z configuration is still fully electrically controlled and does not need an external magnetic field.

For the above mentioned antiferromagnetic planar periodic structure 120, as mentioned above, it includes but is not limited to a one-dimensional periodic arrangement structure or a two-dimensional arrangement of periodic structure. For example, in some embodiments, the antiferromagnetic planar periodic structure 120 may include a plurality of antiferromagnetic strip-like structures that extend along a first direction and are periodically arranged along a second direction perpendicular to the first direction. For example, as shown in FIG. 1A, FIG. 1B and FIG. 1C, the first direction is the y-axis direction, and the second direction is the x-axis direction. Alternatively, the antiferromagnetic planar periodic structure 120 may include a plurality of antiferromagnetic dot-like structures arranged in a two-dimensional array along the first direction and the second direction. For example, the antiferromagnetic strip-like structure discussed here may have a cross-section shape of such as rectangular, square, triangular, trapezoidal or semicircular and the like, and the antiferromagnetic dot-like structure discussed here may have a circular, ring, polygonal or hollow polygonal shape. It should be understood that the principles of the present disclosure are not limited to specific antiferromagnetic structure shapes.

For the antiferromagnetic planar periodic structure 120, the periodic number N is generally more than 5, and preferably more than 10. The calculations show that when the periodic number N is more than 5, the two states of the magnonic crystal device 100, i.e. State 1 and State 2, show different transmittances for the spin wave of a specific frequency, and such transmittance difference becomes more pronounced along with the periodic number N increases. When the periodic number N reaches more than 10, the transmittance difference may reach more than 90%. For example, the transmittance corresponding to State 1 is less than 10%, while the transmittance corresponding to State 2 is about 100%. A large periodic number N may be used, however, from the view of facilitating manufacturing, the periodic number N may be 1000 or less, preferably 100 or less.

The width or diameter of each structural unit in the antiferromagnetic planar periodic structure is between 100 μm and 3 nm, and the spacing between two adjacent structural units is also between 100 μm and 3 nm. Correspondingly, the working frequency of the magnonic crystal device may be between 0.5 GHz and 1 THz. The calculation shows that the size (width or diameter) of the structural unit and the size of the spacing between the structural units may affect the transmission spectrum of the magnonic crystal device 100 on the spin waves. Specifically, when the size (width or diameter) of the structural unit and the size of the spacing between the structural units change, the spin wave frequency band blocked by the magnonic crystal device 100 will also change accordingly. Therefore, the size of the structural unit and the spacing between the structural units may be selected according to the spin wave frequency band which is expected to be blocked.

The ferromagnetic layer 110 may generally have a thickness of 0.5 nm to 15 nm, and from the point of view of facilitating to switch the magnetization, maintaining the transmission of the spin waves, and facilitating manufacturing, preferably a thickness from 0.5 nm to 3 nm. The antiferromagnetic planar periodic structure 120 may generally have a thickness from 1 nm to 15 nm. It should be understood that an appropriate thickness may be selected according to the materials of the ferromagnetic layer 110 and the antiferromagnetic planar periodic structure 120.

For the selection of materials, the ferromagnetic layer 110 includes but is not limited to: Fe, Co, Ni, Mn, rare earth elements and metal alloys thereof, for example, ferromagnetic films, such as CoFeB, NiFe, $SmCo_5$, $Sm_2Co_{17}$, $Nd_2Fe_{14}B$, and the like; Heusler alloy; magnetic metal oxide $Fe_3O_4$; garnet $R_3Fe_5O_{12}$, where R is Y, La, Ce, Pr, Nd, Sm, Eu, Gd, Tb, Dy, Ho, Er, Tm, Yb or Lu; and one antiferromagnetic two-dimensional material or a combination of several ferromagnetic two-dimensional materials of $Co_2S_2$, $CoBr_2$, $CoC_2$, $Cr_2C$, $CrBr_3$, $CrC_2$, $CrGaTe_3$, $CrI_3$, $CrOBr$, $CrWGe_2Te_6$, $CrWI_6$, ErSe, EuOBr, $FeBr_2$, $FeC_2$, $Fe_3GeTe_2$, $FeI_2$, $MnC_2$, $NiBr_2$, $NiC_2$, $NiI_2$, and $VC_2$.

The material of the antiferromagnetic planar periodic structure 120 includes but is not limited to: MnN, IrMn, PtMn, FeMn, PdMn antiferromagnetic film; and one antiferromagnetic two-dimensional material or a combination of several ferromagnetic two-dimensional materials of $CrPS_4$, $CoI_2$, $CoO_2$, $NiO_2$, $CrI_2$, $CrSe_2$, FeSe, $MnBr_2$, $MnCl_2$, $MnI_2$, $VBr_2$, and $VI_2$.

The magnonic crystal device in the present disclosure has a certain spin wave (magnon) working frequency range. The frequency range of the spin wave (magnon) is related to the magnetization orientation, the materials of the ferromagnetic layer and the antiferromagnetic planar periodic structure, as well as the size and periodicity of the antiferromagnetic planar periodic structure as described above, and it is generally within the range of 0.5 GHz to 1 THz.

It may be understood that the transmission of the spin wave may be in the periodic arrangement direction of the antiferromagnetic planar periodic structure. For example, in FIG. 1A, FIG. 1B and FIG. 1C, the excitation of the spin wave may be on the left side of the antiferromagnetic planar periodic structure, and the reception and detection may be on the right side of the antiferromagnetic periodic structure, or vice versa. The excitation way of spin waves comprises, but is not limited to: (1) GSG electrode; (2) laser; and (3) spin injection. The detection way of spin waves comprises, but is not limited to: (1) GSG electrode; (2) laser; (3) inverse spin Hall effect. It should be understood that the excitation and detection of spin waves are all known technical means of the field, and the description will not be repeated.

Figure 2:
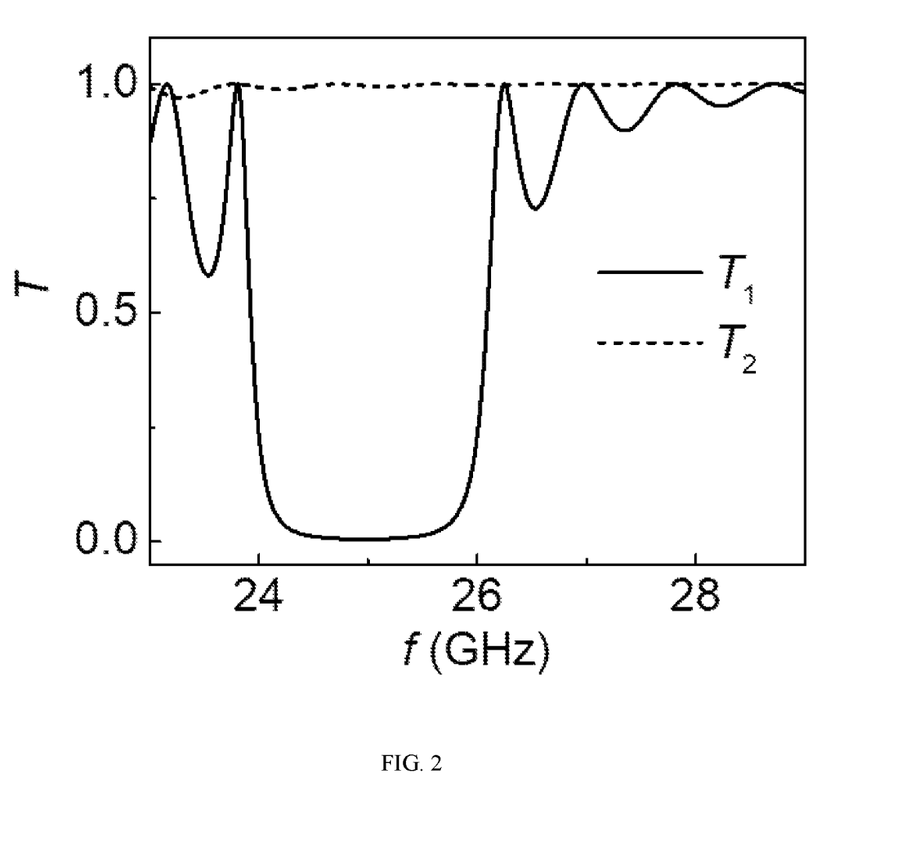
FIG. 2 is a transmission spectrum of a spin wave (magnon) switch according to an exemplary embodiment of the present disclosure.

FIG. 2 is an example of a transmission spectrum of a spin wave (magnon) switch according to an exemplary embodiment of the present disclosure, i.e. the relationship between the transmission coefficient T and the spin wave (magnon) frequency f. It may be seen that when the frequency f of the spin wave (magnon) is within the range of 24.5 GHz to 25.5 GHz, the transmission coefficient T1 of State 1 is close to 0, while the transmission coefficient T2 of State 2 is almost 1, which shows that when the magnonic crystal is in State 1, the spin wave (magnon) is almost impossible to pass through, while in State 2, it almost completely passes through. The "on" and "off" of the spin wave (magnon) may be realized by switching State 1 and State 2 through SOT. This is a fully electrically controlled spin wave (magnon) switch based on a magnonic crystal.

Figure 3:
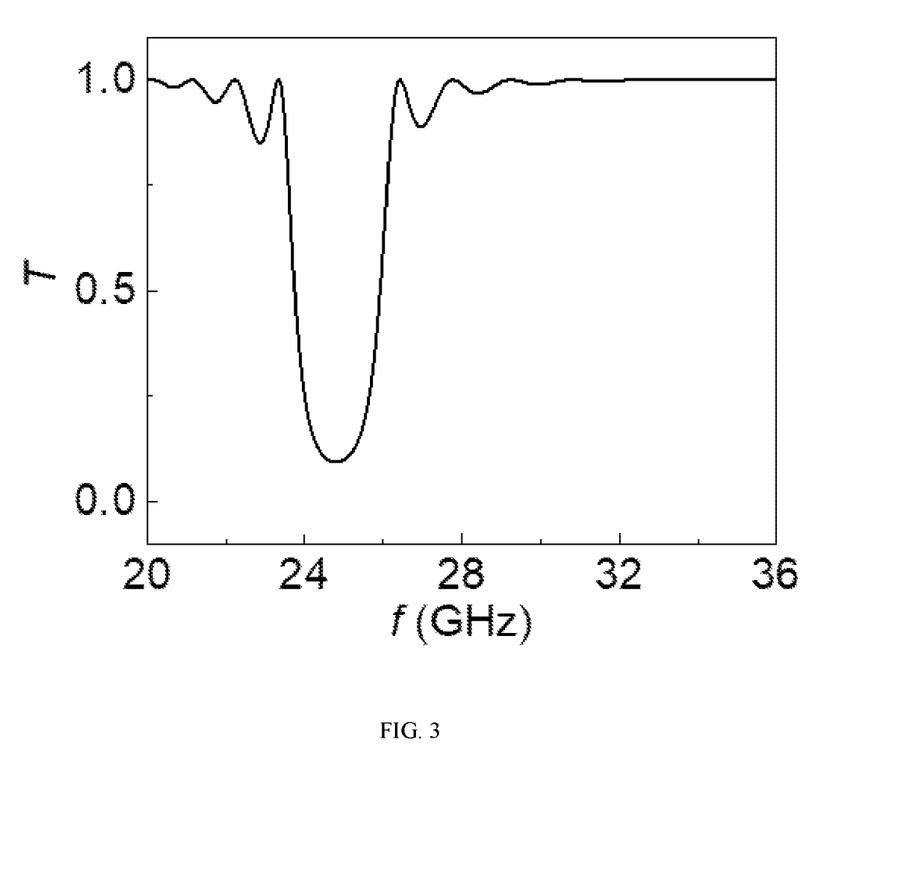
FIG. 3 is a filtering property of a spin wave (magnon) filter according to an exemplary embodiment of the present disclosure.

The magnonic crystal device proposed by the present disclosure may be used as a spin wave (magnon) switch, and it may also be used as a spin wave (magnon) filter. FIG. 3 is an example of a filtering property of a spin wave (magnon) filter according to an exemplary embodiment of the present disclosure. It may be found that, for the spin wave (magnon) within some frequency regions, the spin wave (magnon) has very small transmission coefficient T, and it is difficult to pass through, while the spin wave (magnon) within other frequency regions is almost completely pass through, which may be used to construct a spin wave (magnon) filter, here is a band stop filter. Different from the above mentioned spin wave (magnonic) switch, the realization of the spin wave (magnonic) filter only needs to fix the magnonic crystal device in a certain state: State 1 or State 2. Alternatively, through switching State 1 and State 2, the spin wave frequency band blocked by the filter may be changed.

It should also be understood that the spin wave switch and the filter of the present disclosure may be used in existing current-operated circuits, and they may also be applied in magnon-operated circuits that are developed in the future.

The above description has been provided for the purposes of illustration and description. In addition, this description is not intended to completely limit the embodiments of the present disclosure to the forms disclosed herein. Although various example aspects and embodiments have already been discussed above, those skilled in the art will recognize certain variations, modifications, alterations, additions and sub-combinations based on the above descriptions and examples and embodiments.

What is claimed is:

1. A magnonic crystal device, comprising:
   a ferromagnetic layer;
   an antiferromagnetic planar periodic structure set on the ferromagnetic layer; and
   a spin Hall effect layer set on one side of the ferromagnetic layer opposite to the antiferromagnetic planar periodic structure and in contact with the ferromagnetic layer, and used to switch a magnetization of the ferromagnetic layer.

2. The magnonic crystal device of claim 1, wherein the antiferromagnetic planar periodic structure comprises:
   a plurality of antiferromagnetic strip-like structures that extend along a first direction and are periodically arranged along a second direction perpendicular to the first direction; or
   a plurality of antiferromagnetic dot-like structures arranged in a two-dimensional array.

3. The magnonic crystal device of claim 2, wherein the antiferromagnetic strip-like structure has a rectangular, square, triangular, trapezoidal or semicircular cross-section shape, or
   the antiferromagnetic dot-like structure has a circular, ring, polygonal or hollow polygonal shape.

4. The magnonic crystal device of claim 1, wherein a periodic number N of the antiferromagnetic planar periodic structure is more than 5, and a width of each structural unit in the antiferromagnetic planar periodic structure is between 100 μm and 3 nm, a spacing between two adjacent structural units being also between 100 μm and 3 nm, correspondingly, a working frequency of the magnonic crystal device may be between 0.5 GHz and 1 THz.

5. The magnonic crystal device of claim 1, wherein the ferromagnetic layer has a thickness of 0.5 nm to 15 nm, and the antiferromagnetic planar periodic structure has a thickness from 1nm to 15 nm.

6. A spin wave switch, which comprises a magnonic crystal device including a ferromagnetic layer and an antiferromagnetic planar periodic structure set on the ferromagnetic layer,
   wherein the magnonic crystal device further comprises a spin Hall effect layer set on one side of the ferromagnetic layer opposite to the antiferromagnetic planar periodic structure and in contact with the ferromagnetic layer, and used to switch a magnetization of the ferromagnetic layer.

7. The spin wave switch of claim 6, wherein a frequency of a spin wave turned on or turned off by the spin wave switch is within a range of 0.5 GHz to 1THz.

8. The spin wave switch of claim 6, wherein the antiferromagnetic planar periodic structure comprises:
- a plurality of antiferromagnetic strip-like structures that extend along a first direction and are periodically arranged along a second direction perpendicular to the first direction; or
- a plurality of antiferromagnetic dot-like structures arranged in a two-dimensional array.

9. The spin wave switch of claim 8, wherein the antiferromagnetic strip-like structure has a rectangular, square, triangular, trapezoidal or semicircular cross-section shape, or
the antiferromagnetic dot-like structure has a circular, ring, polygonal or hollow polygonal shape.

10. The spin wave switch of claim 6, wherein a periodic number N of the antiferromagnetic planar periodic structure is more than 5, and a width of each structural unit in the antiferromagnetic planar periodic structure is between 100 μm and 3 nm, a spacing between two adjacent structural units being also between 100 μm and 3 nm, correspondingly, a working frequency of the magnonic crystal device may be between 0.5 GHz and 1THz.

11. The spin wave switch of claim 6, wherein the ferromagnetic layer has a thickness of 0.5 nm to 15 nm, and the antiferromagnetic planar periodic structure has a thickness from 1 nm to 15 nm.

12. A spin wave filter, which comprises a magnonic crystal device including a ferromagnetic layer and an antiferromagnetic planar periodic structure set on the ferromagnetic layer,
wherein the magnonic crystal device further comprises a spin Hall effect layer set on one side of the ferromagnetic layer opposite to the antiferromagnetic planar periodic structure and in contact with the ferromagnetic layer, and used to switch a magnetization of the ferromagnetic layer.

13. The spin wave filter of claim 12, wherein the ferromagnetic layer has a thickness of 0.5 nm to 15 nm, and the antiferromagnetic planar periodic structure has a thickness from 1 nm to 15 nm.

14. The spin wave filter of claim 12, wherein a frequency of a spin wave filtered by the spin wave filter is within a range of 0.5 GHz to 1THz.

15. The spin wave filter of claim 12, wherein the antiferromagnetic planar periodic structure comprises:
- a plurality of antiferromagnetic strip-like structures that extend along a first direction and are periodically arranged along a second direction perpendicular to the first direction; or
- a plurality of antiferromagnetic dot-like structures arranged in a two-dimensional array.

16. The spin wave filter of claim 15, wherein the antiferromagnetic strip-like structure has a rectangular, square, triangular, trapezoidal or semicircular cross-section shape, or
the antiferromagnetic dot-like structure has a circular, ring, polygonal or hollow polygonal shape.

17. The spin wave filter of claim 12, wherein a periodic number N of the antiferromagnetic planar periodic structure is more than 5, and a width of each structural unit in the antiferromagnetic planar periodic structure is between 100 μm and 3 nm, a spacing between two adjacent structural units being also between 100 μm and 3 nm, correspondingly, a working frequency of the magnonic crystal device may be between 0.5 GHz and 1THz.

* * * * *